United States Patent [19]

Ichijyo

[11] Patent Number: 4,812,717
[45] Date of Patent: Mar. 14, 1989

[54] SWEEP CIRCUIT FOR OSCILLOSCOPE

[75] Inventor: Hiroshi Ichijyo, Kawasaki, Japan

[73] Assignee: Kabushiki Kaisha Kenwood, Japan

[21] Appl. No.: 43,751

[22] Filed: Apr. 29, 1987

[30] Foreign Application Priority Data

May 7, 1986 [JP] Japan ................. 61-103156

[51] Int. Cl.⁴ .................. H01J 29/70; H01J 29/72
[52] U.S. Cl. ......................... 315/367; 315/408
[58] Field of Search .............. 315/367, 408, 399;
340/736, 740

[56] References Cited

U.S. PATENT DOCUMENTS 4,642,531  2/1987  Jobling et al. ............ 315/371
4,686,432  8/1987  Berland et al. ........... 315/408
4,698,556 10/1987  Jobling et al. ............ 315/371

Primary Examiner—Theodore M. Blum
Attorney, Agent, or Firm—Gerald J. Ferguson, Jr.

[57] ABSTRACT

The oscilloscope sweeping circuit includes a first D/A converter which converts sweep rate step digital data into a charge current under the weighting of a reference current applied thereto. The charge current charges a capacitor and the amount of the charge determines the sweep rate. The reference current is produced by a second D/A converter which converts fine step digital data into an analog current.

10 Claims, 2 Drawing Sheets

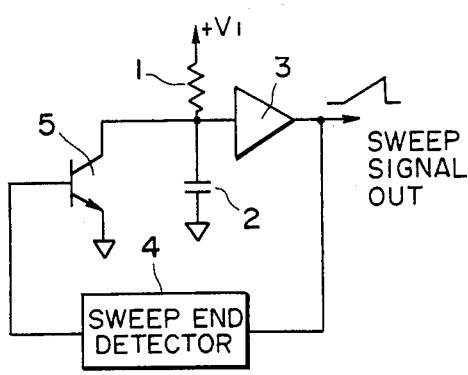
FIG. 1
PRIOR ART
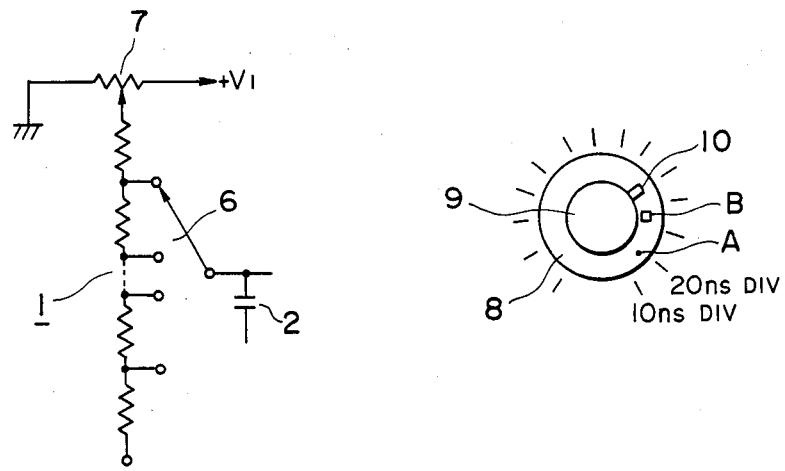
FIG. 2A
PRIOR ART
FIG. 2B
PRIOR ART

SWEEP CIRCUIT FOR OSCILLOSCOPE

BACKGROUND OF THE INVENTION

1. Field of the Invention

The present invention relates to an oscilloscope sweeping circuit, and more particularly to an oscilloscope sweeping circuit which can precisely indicate a sweep rate.

2. Related Prior Art

A conventional sweep circuit of an oscilloscope is constructed, for example, as shown in FIG. 1. A current flowing through a resistor 1 with a constant voltage V1 supplied thereto charges a capacitor 2. A voltage across the capacitor 2 is amplified by an amplifier 3 which outputs a sweep signal. When the sweep signal reaches a predetermined level which is detected by a sweep end detector 4, a transistor 5 is driven to discharge the capacitor 2 to thereby terminate one sweep.

To vary the sweep rate of such a conventional sweep circuit, the supply voltage V1 or the resistance of the resistor 1 is changed.

In the latter method, various combinations of the capacitor 2 and resistance values of the resistor 1 are selected by means of a rotary switch 6 to cover a wide range of sweep rate, as schematically shown in FIG. 2A. Also, fine adjustment of the sweep rate is provided by connecting one end of the resistor 1 to a slide contact of a rheostat 7.

Particularly, as shown in FIG. 2B, there are provided a dial 8 for positioning the rotary switch 6 and a knob 9 coaxially mounted with the dial 8 for turning the slide contact of the rheostat 7. The dial 8 is rotated to stepwise change a sweep rate, whereas the knob 9 is rotated to achieve fine adjustment of a sweep rate. However, a known problem is that if the knob 9 is moved from a calibration position to another position to achieve fine adjustment of a sweep rate, the resultant sweep rate becomes uncalibrated. The reason is that a sweep rate set by rotating the dial 8 and indicated by a sweep rate gradation at mark A is in calibrated state only when a protrusion 10 fixed to the knob 9 is being set at calibration mark B.

Apart from the above, there is provided no means for obtaining sweep rate information from the above arrangement of varying a sweep speed using the rotary switch 6 and the rheostat 7. This becomes a problem especially for a read-out oscilloscope which always requires sweep rate information. Even if a rotational position of the knob 9 is detected using a rotary encoder, for example, the sweep rate cannot always be obtained with high precision due to the position of the slide contact of the rheostat at that time.

It is an object of the present invention to provide an oscilloscope sweeping circuit which can eliminate the above-described problems.

SUMMARY OF THE INVENTION

According to the present invention, there is provided an oscilloscope sweeping circuit comprising means for producing a first reference signal which is a function of fine step digital data applied thereto; means for producing a second reference signal which is a function of said first reference signal and sweep rate step digital data applied thereto; and means responsive to said second reference signal for generating a sweep signal the sweep rate of which is determined by said second reference signal.

BRIEF DESCRIPTION OF THE DRAWINGS

FIG. 1 shows a sweep signal generating circuit according to the prior art.

FIG. 2A illustrates one method of varying a sweep rate of the circuit shown in FIG. 1 according to the prior art.

FIG. 2B schematically shows the dial and knob for changing a sweep rate.

DESCRIPTION OF THE PREFERRED EMBODIMENT.

Figure 3:
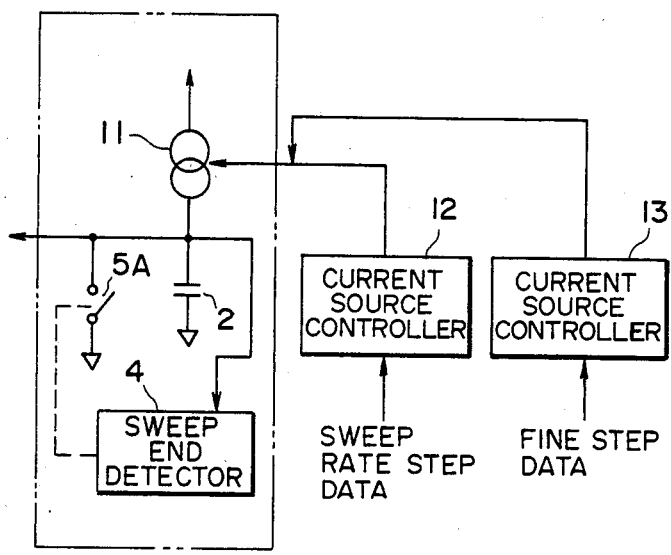
FIG. 3 is a block diagram showing the oscilloscope sweeping circuit arrangement according to the present invention.

FIG. 3 is a block diagram used for explaining the principle of the present invention.

A current outputted from a current source 11 is supplied to a capacitor 2 to charge it. A voltage across the capacitor 2 is detected by a sweep end detector 4. When a sweep signal reaches a predetermined output level, switch means 5A connected in parallel to the capacitor 2 is controlled to become on-state. A current source controller 12 controls the output current of the current source 11 such that the current value becomes a value corresponding to a sweep rate step data having a predetermined step interval and set from the external. Another current source controller 13 controls the output current of the current source 11 such that the current value becomes a value corresponding to the sweep rate step data and a fine step data set from the external, the fine step data determining a value between adjacent sweep rate step data. Thus, the output current of the current source 11 can be controlled using the current source controllers 12 and 13. Also, the sweep rate can be obtained based on the sweep rate step data and the fine step data.

An output current of the current source 11 set by the current source controllers 12 and 13 with sweep rate step data and fine step data inputted thereto charges the capacitor 2 the voltage across which is detected by the sweep end detector 4. When the voltage reaches a predetermined value, switch means 5A is controlled to become on-state and terminate one sweep.

In the above circuit arrangement, an output current of the current source 11 determines a sweep rate, and is set by using the current source controllers 12 and 13. The sweep rate information can be obtained from the sweep rate step data and fine step data used at that time. Further, the sweep rate is always in calibrated conditions.

Figure 4:
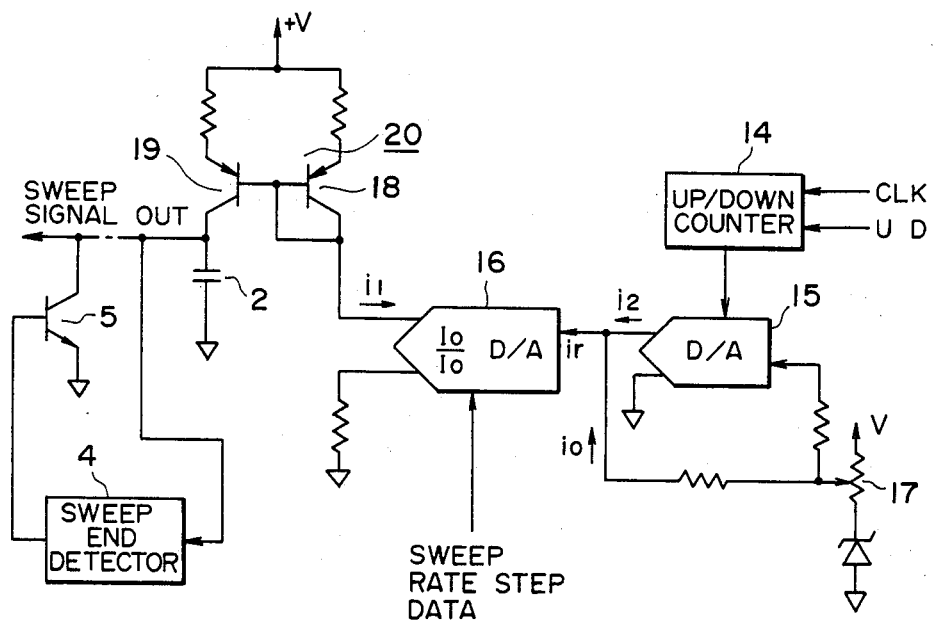
FIG. 4 is a detailed circuit diagram of the circuit shown in FIG. 3.

Next, an embodiment of the present invention will be described. FIG. 4 is a block diagram showing a detailed circuit of that shown in FIG. 3.

In the Figure, reference number 14 denotes an up/down counter, 15 and 16 denote digital/analog converters (hereinafter abbreviated as D/A converter), and 17 denotes a constant voltage source for supplying a reference current to the D/A converters 15 and 16.

A count data of the up/down counter 14 is supplied to the D/A converter 15 as a fine step data. A converted output current $i_2$ from the D/A converter 15 and a current $i_0$ from the constant voltage source 17 are supplied to the D/A converter 16 as a reference current $i_r$. The D/A converter 16 is supplied with a sweep rate step data which corresponds to a sweep rate set by a rotary switch described with reference to the prior art.

A current-miller circuit is constructed of a diode-connected transistor 18 and a transistor 19, the former transistor is supplied with a converted output current $i_f$ of the D/A converter 16. The current $i_f$ is a function of the sweep rate step data and the reference current $i_r$. The current passing through the transistor 19 is supplied to the capacitor 2 the voltage across which is detected by the sweep end detector 4 to drive a transistor 5 and discharge the capacitor 2.

The operation of the circuit constructed as above will be described in comparison with the above-described prior art. In a calibrated state where the protrusion 10 is located at the calibration mark B (as shown in FIG. 2B), the count of the up/down counter 14 is set at a predetermined value, e.g., at a maximum allowable set value. In this state, a reference current $I_r = (i_0 + I_{2max})$ flows into the D/A converter 16. As the sweep rate step data to the D/A converter 16 changes, the converted output current $i_f$ of the D/A converter 16 changes accordingly. The output current $i_f$ is supplied to the capacitor 2 to change the gradient of a sawtooth sweep signal. Thus, a sweep rate is changed by changing the sweep rate step data.

When clock pulses are supplied to the up/down counter 14 as a fine step data, the converted output current $i_2$ of the D/A converter 15 changes in accordance with the count of the up/down counter 14. Assuming that the converted output current $i_2$ has been set at its maximum value $i_{2max}$ which is not larger than $i_0$, the up/down counter 14 is counted down to thereby enable to change the sweep rate within the sweep rate set by the sweep rate step data. A deviation from the above-described calibrated state an be notified by the count of the up/down counter 14. In this embodiment, the sweep rate is always kept in calibrated conditions.

As described so far, according to the present invention, an output current of the current source charges a capacitor which constitutes a part of a sweep circuit, the current being programmably controlled and the current value being identifiable. Therefore, a sweep rate can be notified at any setting conditions.

What is claimed is:

1. An oscilloscope sweep circuit comprising:
    means (e.g., 13, 14, 15) for producing a first reference signal which is a function of fine step digital data applied thereto;
    means (e.g., 12, 16, 20) for producing a second reference signal which is a function of said first reference signal and sweep rate step digital data applied thereto; and
    means (e.g., 2, 4, 5) responsive to said second reference signal for generating a sweep signal the sweep rate of which is determined by said second reference signal whereby said sweep rate step digital data corresponds to a coarse setting of the sweep rate, and said fine step digital data correspond to a fine setting of the sweep rate.

2. The circuit according to claim 1, wherein said second reference signal producing means includes a D/A converter which converts the sweep rate step digital data into an analog signal proportional to said second reference signal under the weighting of said first signal.

3. The circuit according to claim 2, wherein said first reference signal producing means includes a D/A converter which converts the fine step digital data into the first reference signal.

4. The circuit according to claim 3, including an up/down counter means responsive to a clock signal for providing said fine step digital data.

5. The circuit according to claim 4, wherein said up/down counter means has a count set at a predetermined value corresponding to a calibrated setting of the sweep circuit.

6. The circuit according to claim 5, wherein said first reference signal producing means is responsive to a constant voltage source.

7. The circuit according to claim 6, wherein said second reference signal producing means is responsive to said constant voltage source.

8. An oscilloscope sweep circuit comprising:
    an up/down counter means responsive to clock pulses for producing a fine step digital signal, said up/down counter means having a count set at a predetermined value;
    a first digital/analog converter means responsive to said fine step digital signal for producing a first reference signal;
    a second digital/analog converter means responsive to said first reference signal and a sweep rate step digital signal applied thereto for producing a second reference signal; and
    means responsive to said second reference signal for generating a sweep signal the sweep rate of which is determined by said second reference signal;
    wherein said sweep rate step digital signal corresponds to a coarse setting of the sweep rate, and said fine step digital signal corresponds to a fine setting of the sweep rate.

9. A circuit as in claim 8 where said up/down counter means has a count set at a predetermined value corresponding to a calibrated setting of the sweep circuit.

10. A circuit as in claim 9 where, in response to said clock pulses, the count of said up/down counter is adjusted from said predetermined value to another value corresponding to a fine adjustment of the sweep rate, the deviation from the predetermined value to said another value being detectable to maintain calibration of the sweep circuit.

* * * * *